United States Patent
Mizuuchi et al.

(10) Patent No.: US 6,785,457 B2
(45) Date of Patent: Aug. 31, 2004

(54) OPTICAL WAVEGUIDE DEVICE AND COHERENT LIGHT SOURCE AND OPTICAL APPARATUS USING THE SAME

(75) Inventors: Kiminori Mizuuchi, Neyagawa (JP);
Kazuhisa Yamamoto, Takatsuki (JP);
Ken'ichi Kasazumi, Takatsuki (JP);
Yasuo Kitaoka, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/211,881

(22) Filed: Aug. 1, 2002

(65) Prior Publication Data

US 2003/0026573 A1 Feb. 6, 2003

(30) Foreign Application Priority Data

Aug. 1, 2001 (JP) .................................. 2001-233225

(51) Int. Cl.⁷ .............................................. G02F 2/02
(52) U.S. Cl. .................... 385/129; 385/122; 359/328
(58) Field of Search ..................... 385/122, 129–132, 385/14, 5; 359/326–332; 372/21, 22

(56) References Cited

U.S. PATENT DOCUMENTS

| | | | |
|---|---|---|---|
| 4,094,579 A | * 6/1978 | McMahon et al. | 385/49 |
| 4,198,115 A | * 4/1980 | Kaminow | 385/11 |
| 4,901,123 A | * 2/1990 | Noguchi et al. | 257/98 |
| 4,965,525 A | * 10/1990 | Zah | 359/344 |
| 5,022,729 A | * 6/1991 | Tamada et al. | 359/328 |
| 5,119,384 A | * 6/1992 | Chikuma | 372/21 |
| 5,836,073 A | * 11/1998 | Mizuuchi et al. | 29/600 |
| 6,008,675 A | * 12/1999 | Handa | 327/96 |
| 6,118,803 A | * 9/2000 | Sanders et al. | 372/50 |
| 6,134,372 A | * 10/2000 | Ichikawa et al. | 385/140 |
| 6,542,533 B1 | * 4/2003 | Parayanthal | 372/64 |
| 2001/0043773 A1 | 11/2001 | Kasazumi et al. | |

FOREIGN PATENT DOCUMENTS

| | | | | |
|---|---|---|---|---|
| JP | 03256031 A | * 11/1991 | | G02F/1/37 |
| JP | 04221872 A | * 8/1992 | | H01S/3/18 |
| JP | 5-323401 | 12/1993 | | |
| JP | 05323401 A | * 12/1993 | | G02F/1/37 |
| JP | 5-323404 | 12/1993 | | |
| JP | 10300959 A | * 11/1998 | | G02B/6/122 |
| JP | 2000-171653 | 6/2000 | | |
| JP | 2001111177 A | * 4/2001 | | H01S/5/50 |
| WO | WO 200113479 A1 | * 2/2001 | | G02F/1/015 |
| WO | WO 200117076 A2 | * 3/2001 | | H01S/5/00 |

* cited by examiner

Primary Examiner—Hemang Sanghavi
Assistant Examiner—Scott Alan Knauss
(74) Attorney, Agent, or Firm—Merchant & Gould P.C.

(57) ABSTRACT

The present invention aims to simplify a mass production process of an optical waveguide device and to reduce cost as well as noise. The optical waveguide device includes an optical waveguide whose entrance end face and exit end face are substantially parallel to each other. A SHG device is mass-produced by optically polishing an optical material substrate with a large area and then cutting the substrate. This method can mass-produce the optical waveguide devices having a uniform device length. The angle between the exit end face of the optical waveguide and the direction of an optical axis of the optical waveguide at the exit end face is not 90°, thereby reducing return light from the exit end face.

12 Claims, 8 Drawing Sheets

OPTICAL WAVEGUIDE DEVICE AND COHERENT LIGHT SOURCE AND OPTICAL APPARATUS USING THE SAME

BACKGROUND OF THE INVENTION

1. Field of the Invention

The present invention relates to an optical waveguide device used, e.g., in the fields of optical information processing and optical application measurement and control, and to a coherent light source and an optical apparatus using the same.

2. Description of the Related Art

Optical information recording/reproducing apparatuses can achieve higher density by using a shorter-wavelength light source. For example, a widespread compact disk (CD) apparatus uses near-infrared light having a wavelength of 780 nm, while a digital versatile disk (DVD) apparatus that can reproduce information with higher density uses a red semiconductor laser having a wavelength of 650 nm. To achieve a next-generation optical disk apparatus with even higher density, a blue laser source with even shorter wavelength has been under active development. For example, to provide a small and stable blue laser source, a second harmonic generation (hereinafter, referred to as "SHG") device has been developed by using a nonlinear optical material.

FIG. 6 is a schematic view showing an example of the configuration of an optical apparatus that includes a SHG blue light source using a SHG device.

First, the SHG blue light source will be described by referring to FIG. 6.

As shown in FIG. 6, a SHG blue light source 101 includes a SHG device 103 and a semiconductor laser 104. The semiconductor laser 104 is connected directly to the SHG device 103.

The SHG device (optical waveguide device) 103 includes an optical material substrate 105. A high refractive index region with a width of about 3 $\mu$m and a depth of about 2 $\mu$m is formed on the optical material substrate 105 by a proton-exchange method. This high refractive index region functions as an optical waveguide 106. Infrared light having a wavelength of 850 nm is emitted from the semiconductor laser 104, focused on an entrance end face 106a of the optical waveguide 106 on the SHG device 13, and propagates in the optical waveguide 106 so as to be a fundamental guided wave. LiNbO$_3$ crystals, which are used as a substrate material for the optical material substrate 105, have a large nonlinear optical constant. Therefore, a harmonic guided wave having half the wavelength of the fundamental light (425 nm) is excited from the electric field of the fundamental light. To compensate for a difference in propagation constant between the fundamental light and the harmonic light, a periodic polarization inversion region 107 is formed on the optical waveguide 106. The harmonic light that is excited over the entire region of the optical waveguide 106 is added coherently, which then exits from an exit end face 106 of the optical waveguide 106.

It is necessary to maintain the wavelength of the fundamental light precisely constant to ensure accurate compensation for the difference in propagation constant between the fundamental light and the harmonic light. Therefore, a distributed Bragg reflection (hereinafter, referred to as "DBR") semiconductor laser is used as the semiconductor laser 104. The DBR semiconductor laser includes a DBR region and shows extremely small wavelength variations with respect to temperature or the like.

Next, the operation of an optical pickup system that includes the SHG blue light source using the SHG device will be described by referring to FIG. 6.

As shown in FIG. 6, an optical apparatus 102 includes the SHG blue light source (coherent light source) 101, a focusing optical system, and a photodetector 112. The SHG blue light source 101 includes the SHG device 103 and the semiconductor laser 104. The focusing optical system includes a collimator lens 108, polarizing beam splitter 109, a quarter-wave plate 110, and an objective lens 111.

The harmonic blue light emitted from the SHG device 103 passes through the collimator lens 108, the polarizing beam splitter 109, the quarter-wave plate 110, and the objective lens 111 in sequence, and thus is focused on an optical disk 113. The light modulated by the optical disk 113 is reflected from the polarizing beam splitter 109 and directed to the photodetector 112 through a focusing lens (not shown), thereby providing a reproduction signal. At this time, linearly polarized light emitted from the SHG device 103 in the direction parallel to the sheet of the drawing is polarized in the direction perpendicular thereto by passing through and returning to the quarter-wave plate 110. All the reflected light from the optical disk 113 is deflected by the polarizing beam splitter 109 and does not return to the side of the SHG blue light source 101.

However, the base material for the actual optical disk 113 has a birefringent property. Thus, undesired polarized components generated in the optical disk 113 may pass through the polarizing beam splitter 109 and return to the side of the SHG blue light source 101, which is referred to as return light. During reproduction of the optical disk 113, the position of the objective lens 111 is controlled so as to ensure precise focusing on the optical disk 113. Therefore, the exit end face 106b and the optical disk 113 constitute a confocal optical system, and the reflected light from the optical disk 113 is focused precisely on the exit end face 106b.

When the reflected light from the optical disk 113 returns to the side of the SHG blue light source 101 as described above, noise is caused. To avoid this noise, various techniques have been proposed. Examples of such techniques include a method for generating a plurality of longitudinal modes by modulating a semiconductor laser with a high frequency signal and a method for also generating a plurality of longitudinal modes by causing self-oscillation in a semiconductor laser. In the field of optical communication, an optical isolator that has a magneto-optical effect generally is located between a semiconductor laser and an optical fiber so that light from the semiconductor laser is focused on the optical fiber. Moreover, another method has been proposed that prevents reflected light from returning to a semiconductor laser by cutting the entrance end face of an optical fiber or an optical waveguide so as to reflect the reflected light obliquely (JP 5(1993)-323404 A or the like).

These techniques reduce noise caused by light returning to the semiconductor laser. As a result of experiments on reproduction of the optical pickup that includes the optical waveguide type SHG device 103 shown in FIG. 6, the present inventors found noise caused by a different mechanism from that of the conventional noise induced by return light. This noise is interference noise generated when the return light focused on the exit end face 106b is reflected and interferes with light emitted from the optical waveguide 106. The output power of the SHG blue light source 101 appears to change due to this interference effect when observed from the optical disk side, and a reproduction signal of the optical disk 113 is modulated by low frequency noise, which leads to degradation of the reproduction signal. The noise induced by the return light in the semiconductor laser 104 is generated by the interaction between light inside the semiconductor laser 104 and the return light. On the other hand, the interference noise is generated by the interference between light emitted from the SHG blue light source 101 and the return light.

As described above, there are two different types of noise in the optical system that uses the optical waveguide device (the SHG device 103): low frequency interference noise and mode hopping noise. The low frequency interference noise occurs when light emitted from the SHG blue light source 101 is reflected and returns to the exit end face of the SHG blue light source 101 to cause interference in the optical system outside the SHG blue light source. The mode hopping noise results from the inside of the semiconductor laser 104. Various techniques have been proposed as a method for reducing the mode hopping noise. JP 2000-171653 A discloses a technique for reducing return light to the SHG blue light source 101 and interference noise in the confocal optical system. According to this technique, the exit end face 106b of the optical waveguide 106 tilts with respect to the direction of an optical axis passing through the optical waveguide 106 (i.e., the propagation direction of a guided wave), as shown in FIGS. 7, 8 and 9. Therefore, the harmonic light reflected from the exit end face 106b does not travel in the direction of the optical axis of the optical waveguide 106. Thus, the interference between light exiting from the SHG device 103 and the reflected light can be reduced to prevent the occurrence of interference noise.

To make the SHG blue light source 101 smaller, the semiconductor laser 104 and the optical waveguide 106 are coupled directly with high efficiency. For this purpose, the distance between the semiconductor laser 104 and the entrance end face of the SHG device 103 should be a few micrometers or less, and the optical waveguide 106 should be formed so that the direction of the optical axis of the optical waveguide 106 is substantially perpendicular to the entrance end face 106a. Moreover, to achieve high-efficiency wavelength conversion, the conditions of single phase matching should be satisfied over a long distance. Therefore, it is desirable that both the propagation direction and the propagation constant are uniform over the longest possible distance of the optical waveguide. Thus, a straight waveguide is suitable for high-efficiency wavelength conversion.

JP 5(1993)-323401 A discloses an optical wavelength conversion device that has a periodic polarization inversion structure and includes a curved optical waveguide, though the object and the effect differs from those of the present invention. The invention disclosed in JP 5(1993)-323401 A employs a curved optical waveguide that can change the propagation direction of a guided wave gradually, thereby changing the phase matching conditions of the optical waveguide in accordance with the propagation direction and increasing the tolerance of a phase-matched wavelength.

However, there is a serious problem in mass production of the SHG device 103 that includes the optical waveguide 106 whose entrance and exit end faces 106a, 106b are not parallel to each other. As shown in FIG. 10, the SHG device 103 is produced generally by optically polishing the optical material substrate 114 and then cutting the substrate into a small size. Usually, to simplify the optical polishing process and improve polishing accuracy, a relatively large optical material substrate is polished optically and then cut. When this method is used to mass-produce the SHG device 103 in which the entrance end face 106a is not parallel to the exit end face 106b, the device length varies from one device to another so that the mass production of uniform SHG devices 103 is impossible.

The conventional optical wavelength conversion device that has the periodic polarization inversion structure and includes the curved optical waveguide differs from the present invention in object and effect. Though the use of the curved optical waveguide can increase the tolerance of a phase-matched wavelength, it involves a significant reduction in the efficiency of wavelength conversion. Moreover, JP 5(1993)-323401 A fails to disclose the relationship between the entrance end face and the exit end face of the optical waveguide. It also fails to describe any problem in terms of simplicity of a mass production process.

SUMMARY OF THE INVENTION

Therefore, with the foregoing in mind, it is an object of the present invention to provide an optical waveguide device that can be mass-produced easily. It is another object of the present invention to provide a coherent light source that uses the optical waveguide device to satisfy the light source characteristics of low noise. It is yet another object of the present invention to provide an optical apparatus that uses the coherent light source to reduce interference noise caused outside of the light source.

To achieve the above objects, an optical waveguide device according to a configuration of the present invention includes a substrate provided with an optical waveguide, and an entrance end face and an exit end face formed on the end portions of the optical waveguide. The entrance end face is substantially parallel to the exit end face. The angle $\theta$ between the exit end face and the direction of an optical axis of the optical waveguide at the exit end face is not 90°.

In the optical waveguide device of the present invention, it is preferable that the optical waveguide device is substantially in the form of a rectangular parallelepiped.

In the optical waveguide device of the present invention, it is preferable that the angle $\theta$ satisfies $\theta \leq 87°$ or $\theta \geq 93°$.

In the optical waveguide device of the present invention, it is preferable that the angle $\theta$ satisfies $80° \leq \theta \leq 87°$ or $100° \geq \theta \geq 93°$.

In the optical waveguide device of the present invention, it is preferable that the optical waveguide includes a straight waveguide that extends from the entrance end face in the direction substantially perpendicular to the entrance end face and at least one inclined waveguide that is formed between the entrance end face and the exit end face. In this case, it is preferable that a plurality of guided waves with different wavelengths propagate in the optical waveguide, and the radiation loss in the inclined waveguide differs depending on the guided waves. Moreover, it is preferable that the inclined waveguide includes a straight portion and a curved portion.

In the optical waveguide device of the present invention, it is preferable that the substrate is made of MgO-doped $LiNbO_3$ crystals, and the entrance end face and the exit end face are substantially parallel to an X-plane or Y-plane of the crystals.

In the optical waveguide device of the present invention, it is preferable that the optical waveguide has a periodic polarization inversion structure.

A coherent light source according to a configuration of the present invention includes a semiconductor laser and an optical waveguide device. An optical waveguide device of the present invention is used as the optical waveguide device.

In the coherent light source of the present invention, it is preferable that the optical waveguide device is a second harmonic generation device and converts fundamental light having a wavelength of λ1 that is emitted from the semiconductor laser into second harmonic light having a wavelength of λ2. In this case, it is preferable that at least one of the entrance end face and the exit end face of the optical waveguide is provided with an antireflection film to be used for at least one of the fundamental light and the second harmonic light. Moreover, it is preferable that at least one of the entrance end face and the exit end face of the optical waveguide is provided with an antireflection film to be used for the fundamental light.

An optical apparatus according to the configuration of the present invention includes a coherent light source and a focusing optical system for focusing light emitted from the coherent light source on an object to be observed. A coherent light source of the present invention is used as the coherent light source. The optical waveguide device of the coherent light source and the object to be observed have a confocal relationship.

In the optical apparatus of the present invention, it is preferable that the object to be observed is an optical disk.

DESCRIPTION OF THE PREFERRED EMBODIMENTS

The present invention provides an optical waveguide device that includes a substrate provided with an optical waveguide. The optical waveguide device is capable of reducing return light from the exit end face of the optical waveguide and has a device structure suitable for mass production.

Specifically, the entrance and exit end faces of the optical waveguide are substantially parallel to each other, thereby eliminating a variation in device length of the optical waveguide devices obtained by a mass production process. This configuration makes it possible to manufacture the optical waveguide devices having a uniform device length even with a mass production method in which a relatively large optical material substrate is polished optically and then cut.

To reduce return light from the exit end face of the optical wave guide, the optical waveguide in the vicinity of the exit end face is formed so that the angle between the direction of an optical axis passing through the optical waveguide (i.e., the propagation direction of a guided wave) and the exit end face is not 90°. This configuration can be achieved by introducing an "inclined structure" to the optical waveguide.

A straight waveguide is formed from the entrance end face to the vicinity of the exit end face of the optical waveguide so as to achieve high-efficiency wavelength conversion. Moreover, an inclined waveguide is formed in the vicinity of the exit end face so as to make an angle other than 90° between the direction of the optical axis of the optical waveguide and the exit end face, thus achieving a significant reduction in return light from the exit end face.

The stability of optical output can be improved significantly by using a second harmonic generation device that includes an optical waveguide having a periodic polarization inversion structure as the optical waveguide device. Since the second harmonic generation device utilizes the nonlinear optical effect, it can reduce output caused by temperature distribution in the device.

An optical apparatus of the present invention includes a coherent light source and a focusing optical system. The coherent light source includes a semiconductor laser and the optical waveguide device of the present invention. The focusing optical system focuses light emitted from the optical waveguide device on an object to be observed. The optical apparatus is characterized by a confocal relationship between the optical waveguide device and the object to be observed. This configuration can prevent return light from the external optical system from being reflected by the exit end face of the optical waveguide and interfering with light exiting from the optical waveguide, and thus provide a stable light source without causing interference noise.

First Embodiment

Figure 1:
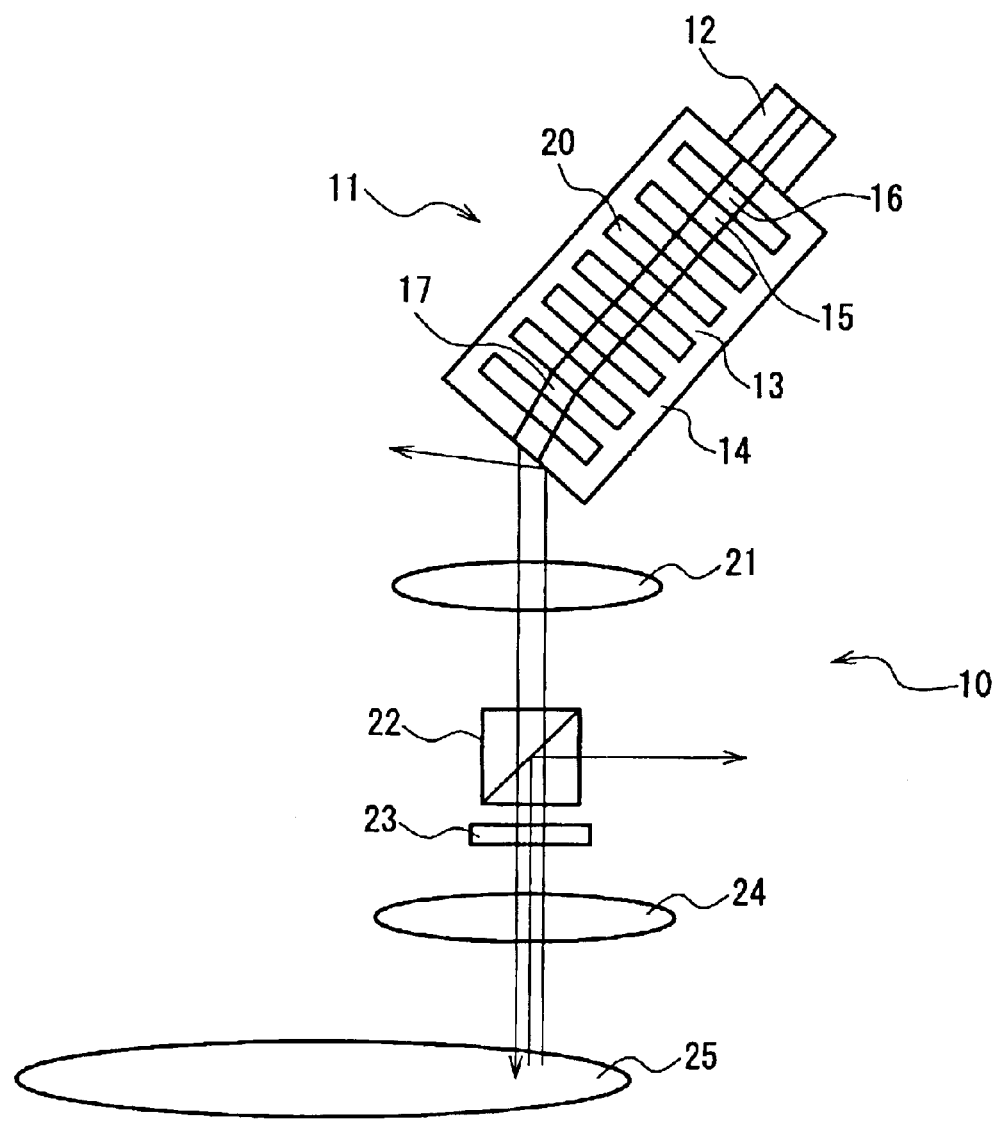
FIG. 1 is a schematic view showing the configuration of an optical apparatus according to a first embodiment of the present invention.
Figure 2:
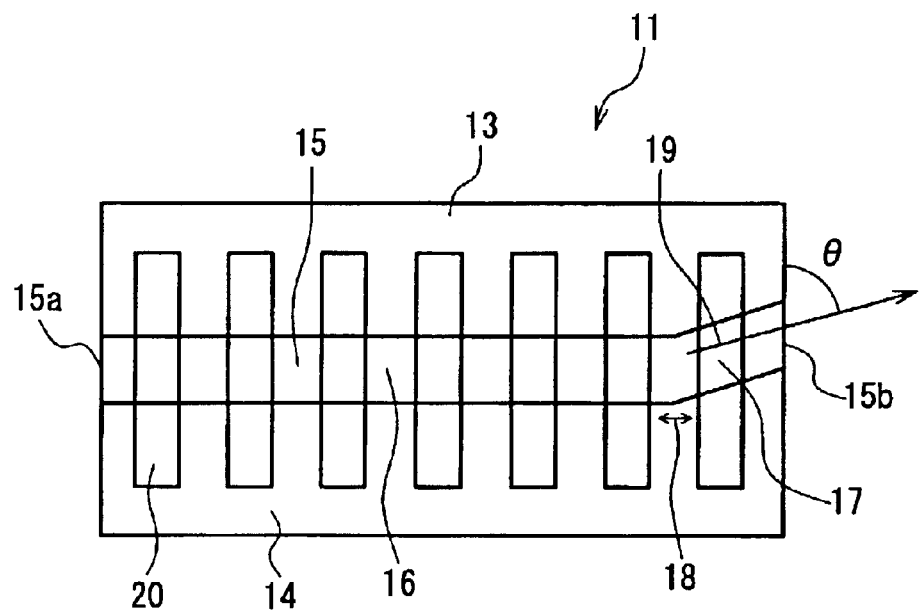
FIG. 2 is a plan view showing an optical waveguide device that is a component of an optical apparatus according to the first embodiment.

FIG. 1 is a schematic view showing the configuration of an optical apparatus according to a first embodiment of the present invention. FIG. 2 is a plan view showing an optical waveguide device that is a component of the optical apparatus in FIG. 1.

As shown in FIGS. 1 and 2, an optical apparatus 10 includes a coherent light source 11. The coherent light source 11 includes a semiconductor laser 12 and an optical waveguide device. A second harmonic generation device (SHG device) 13 that has the following configuration is used as the optical waveguide device.

The SHG device 13 is substantially in the form of a rectangular parallelepiped and includes an optical material substrate 14 made of MgO-doped $LiNbO_3$ crystals. A high refractive index region with a width of about 3 μm and a depth of about 2 μm is formed on the optical material substrate 14 by a proton-exchange method. This high refractive index region functions as an optical waveguide 15. Fundamental light having a wavelength of 820 nm is emitted from the semiconductor laser 12, focused on an entrance end face 15a of the optical waveguide 15 on the SHG device 13, and propagates in the optical waveguide 15 so as to be a fundamental guided wave. The MgO-doped LiNbO$_3$ crystals, which are used as a substrate material for the optical material substrate 14, have a large nonlinear optical constant. Therefore, a harmonic guided wave having half the wavelength of the fundamental light (410 nm) is excited from the electric field of the fundamental light. To compensate for a difference in propagation constant between the fundamental light and the harmonic light, a periodic polarization inversion region 20 is formed on the optical waveguide 15. The harmonic light that is excited over the entire region of the optical waveguide 15 is added coherently, which then exits from an exit end face 15b of the optical waveguide 15.

It is desirable to maintain the wavelength of the fundamental light precisely constant to ensure accurate compensation for the difference in propagation constant between the fundamental light and the harmonic light. Therefore, a DBR semiconductor laser may be used as the semiconductor laser 12. The DBR semiconductor laser includes a DBR region and shows extremely small wavelength variations with respect to temperature or the like. In addition to such small wavelength variations, the DBR semiconductor laser also is characterized by high coherence and small noise because it oscillates with a single wavelength.

The entrance end face 15a and the exit end face 15b of the optical waveguide 15 are substantially parallel to each other. The optical waveguide 15 includes a straight waveguide 16 and an inclined waveguide 17. The straight waveguide 16 extends from the entrance end face 15a in the direction substantially perpendicular thereto. The inclined waveguide 17 is formed in the vicinity of the exit end face 15b to change the propagation direction of a guided wave. The inclined waveguide 17 is connected smoothly to the straight waveguide 16. The inclined waveguide 17 includes a curved portion 18, which is a connection to the straight waveguide 16, and a straight portion 19. Since the straight waveguide 16 is substantially perpendicular to the entrance end face 15a, the semiconductor laser 12 can be coupled directly to the straight waveguide 16 with high efficiency. Moreover, the direction of an optical axis passing through the straight portion 19 (i.e., the propagation direction of a guided wave) forms an angle $\theta$ with the exit end face 15b and an angle (90°−$\theta$) with respect to normal to the exit end face 15b. Here, $\theta$ is not 90°. The inclined waveguide 17 extends straight in the vicinity of the exit end face 15b, so that the angle $\theta$ becomes constant in the vicinity of the exit end face 15b. In this embodiment, the optical waveguide 15 may be formed, e.g., under the following conditions: the device length of the SHG device 13 is 10.5 mm; the length of the straight waveguide 16 is 10 mm; the length of the inclined waveguide 17 measured when it is projected on an extension of the straight waveguide 16 is 0.5 mm; the length of the curved portion 18 is 0.1 mm; the angle $\theta$ between the direction of the optical axis of the inclined waveguide 17 and the exit end face 15b is 84°; and the straight portion 19 tilts 6° with respect to the direction of the optical axis of the straight waveguide 16.

As described above, the optical material substrate 14 is made of MgO-doped LiNbO$_3$ crystals, and the entrance and exit end faces 15a, 15b of the optical waveguide 15 are substantially parallel to an X-plane or Y-plane of the crystals.

As shown in FIG. 1, the optical apparatus 10 includes a collimator lens 21. The collimator lens 21 serves as a collimating optical system that collimates light emitted from the coherent light source 11. The optical apparatus 10 also includes a polarizing beam splitter 22, a quarter-wave plate 23, and an objective lens 24. The collimator lens 21 and the objective lens 24 constitute a focusing optical system that focuses light emitted from the coherent light source 11 on an optical disk 25.

The light from the SHG device 13 exits obliquely with respect to the exit end face 15b. Therefore, the collimator lens 21 is located in the center of distribution of light exiting from the optical waveguide 15. The surface of the optical disk (the object to be observed) 25 and the exit end face of the SHG device (the optical waveguide device) 13, i.e., the exit end face 15b of the optical waveguide 15, constitute a confocal optical system.

Next, the operation of an optical apparatus (optical pickup system) that includes the coherent light source using the SHG device will be described by referring to FIG. 1.

As shown in FIG. 1, light emitted from the semiconductor laser 12 passes through the SHG device 13, the collimator lens 21, the polarizing beam splitter 22, the quarter-wave plate 23, and the objective lens 24 in sequence, and thus is focused on the optical disk 25. The harmonic light reflected from the optical disk 25 passes through the quarter-wave plate 23 with its polarization rotated, then is reflected from the polarizing beam splitter 22, and is directed to a photodetector (not shown) through a focusing lens (not shown), thereby providing a reproduction signal. However, when polarization is not performed sufficiently by the quarter-wave plate 23 due to birefringence of the optical disk 25, a portion of the harmonic light may pass through the polarizing beam splitter 22 and return to the side of the SHG device 13. This is referred to as return light.

In the SHG device 13 of this embodiment, the optical waveguide 15 includes the straight waveguide 16 and the inclined waveguide 17: the straight waveguide 16 extends from the entrance end face 15a in the direction substantially perpendicular thereto, and the inclined waveguide 17 is formed in the vicinity of the exit end face 15b. Moreover, the direction of the optical axis of the inclined waveguide 17 tilts with respect to the exit end face 15b. Therefore, light reflected from the exit end face 15b does not return to the confocal optical system, thus achieving a significant reduction in interference noise.

To operate the semiconductor laser 12 stably, the return light from the exit end face 15b should be suppressed to not more than 0.1% of the exit light. When the angle $\theta$ between the exit end face 15b and the direction of the optical axis of the inclined waveguide 17 is not more than 87° or not less than 93°, the return light from the exit end face 15b can be suppressed to 0.1% or less. Therefore, the angle between the normal to the exit end face 15b and the direction of the optical axis of the inclined waveguide 17 is desirably not less than ±3°, and more desirably not less than ±5° particularly when considering the return light caused by the state of the exit end face 15b or impurity particles. However, if this angle is more than ±10°, propagation loss of the optical waveguide 15 is increased. Thus, it is desirable that this angle should be not more than ±10°.

The coherent light source 11 of this embodiment mainly utilizes the harmonic light that is converted from the fundamental light, and the confocal optical system is designed for the harmonic light. Therefore, the conditions of the confocal optical system are not applied to the fundamental light because of its chromatic aberration. Thus, the proportion of the fundamental light returning from the outside to the coherent light source 11 is extremely small. Consequently, the return light from the exit end face 15b to the semiconductor laser 12 can be reduced to −40 dB or less, and noise caused by the return light can be suppressed.

By appropriately setting the length of the curved portion 18 and the angle between the exit end face 15b and the direction of the optical axis of the inclined waveguide 17, radiation loss can be reduced. The radiation loss occurs at the connection (the curved portion 18) between the straight waveguide 16 and the inclined waveguide 17. The experiments proved that the radiation loss of the harmonic light was about 50% when the length of the curved portion 18 was zero and θ was 6°. On the other hand, the radiation loss of the harmonic light was about zero when the length of the curved portion 18 was not less than 0.1 mm and θ was 6°. To prevent the radiation loss in the curved portion 18, its length should be 0.1 mm or more. This can make the radiation loss in the curved portion 18 approximately zero. In other words, the efficiency of wavelength conversion of the SHG device 13 having a device length of 10.5 mm, in which the straight waveguide 16 is 10 mm and the inclined waveguide 17 is 0.5 mm measured when it is projected on an extension of the straight waveguide 16, is the same as that of a SHG device that has a device length of 10 mm and includes a straight waveguide. As described above, it is possible to achieve the SHG device 13 that can perform wavelength conversion with high efficiency and prevent the return light only by increasing the device length by 1.05 times.

In this embodiment, the curved portion 18 has a length of about 0.1 mm (θ=6°). When the length of the curved portion 18 is not more than 10 μm, the radius of curvature of the curved portion 18 is decreased to cause an increase in radiation loss in the curved portion 18. Though the optical waveguide 15 is designed to operate under the single mode conditions for the fundamental light, it operates under the multimode conditions for the harmonic light. Therefore, a sharp increase in curvature of the curved portion 18 leads to a large effect of perturbation on the harmonic light propagating in the inclined waveguide 17. Consequently, the single-mode harmonic light that has propagated in the straight waveguide 16 is converted into other higher-order modes. Thus, it is desirable that the length of the curved portion 18 should be not less than 0.1 mm.

The entrance end face 15a and the exit end face 15b of the optical waveguide 15 are substantially parallel to each other, thereby simplifying a method for mass-producing the SHG device 13.

The SHG devices can be mass-produced by optically polishing an optical material substrate with a large area and then cutting the substrate. This method allows such a large optical material substrate to be polished at one time. Therefore, it has the advantages of simplifying the mass production, reducing the cost of mass-producing the SHG devices, and improving the polishing accuracy of the optical material substrate.

However, the above method cannot be used to mass-produce the conventional SHG devices, in which the entrance end face and the exit end face of the optical waveguide are not parallel to each other, because the device length varies from one device to another.

The SHG devices can be mass-produced also by cutting an optical material substrate and then optically polishing each of the obtained substrates. However, the SHG devices after being cut into a small size have to be fixed for optical polishing. This makes the optical polishing more complicated and an improvement in polishing accuracy more difficult. In particular, when the SHG devices having a width of not more than 1 mm are mass-produced, it is very difficult to fix the SHG devices for polishing after cutting the optical material substrate. In this case, it is also difficult to control the angle at the exit end face of the optical waveguide precisely.

Figure 3:
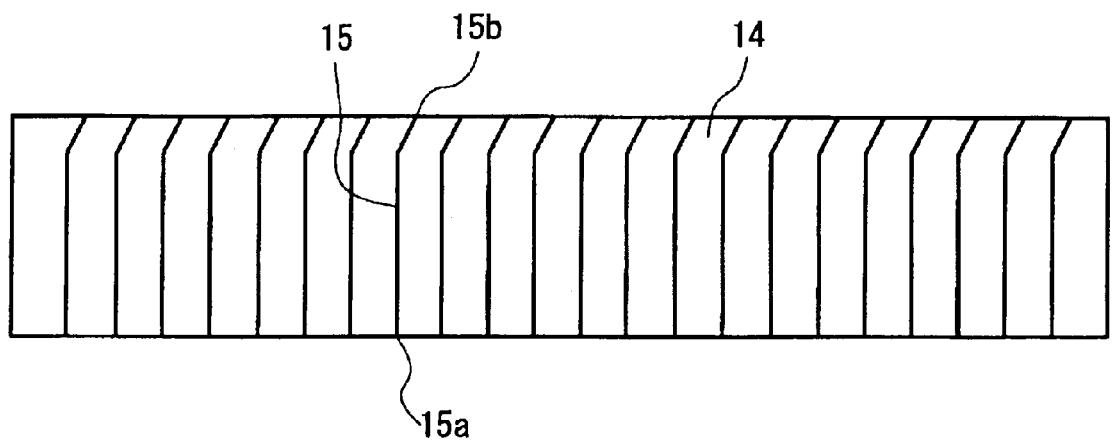
FIG. 3 is a plan view showing an optical material substrate used for mass production of an optical waveguide device according to the first embodiment.

When the SHG device 13 of this embodiment, in which the entrance end face 15a and the exit end face 15b of the optical waveguide 15 are parallel to each other, is mass-produced by optically polishing the optical material substrate 14 with a large area and then cutting the substrate, the SHG devices 13 having a uniform device length can be obtained, as shown in FIG. 3. Moreover, this method can simplify the mass production, reduce the cost of mass-producing the SHG device 13, and improve the polishing accuracy of the optical material substrate 14. Even if the SHG device 13 has a width of not more than 1 mm, it can be mass-produced easily.

The SHG device 13 taking advantage of the nonlinear optical effect uses a nonlinear grating that has a periodic polarization inversion structure to satisfy the quasi phase matching conditions of the fundamental light and the second harmonic light, thus achieving high-efficiency wavelength conversion. However, since the phase matching conditions are satisfied by the periodic structure of the grating, there is a very strict requirement for uniformity in a propagation constant of the optical waveguide 15 and the periodic structure of the grating. A slightly degraded uniformity in the propagation constant and the periodic structure causes a significant reduction in conversion efficiency. The tolerance of variation in width and polarization inversion period of the optical waveguide 15 is several percent or less. In the SHG device 13 that requires the strict uniformity as described above, the output stability is decreased with an increase in output of the second harmonic light generated, and the efficiency of the wavelength conversion becomes saturated. The reason for this is that the optical waveguide 15 absorbs a small amount of second harmonic light to cause temperature distribution, which was found to be responsible for nonuniformity of the optical waveguide 15. That is, the second harmonic light increases in proportion to the square of a propagation distance in the optical waveguide 15. Moreover, the intensity distribution of the second harmonic light increases in proportion to the square of a device length in the optical waveguide 15. Therefore, the optical waveguide 15 has temperature distribution in the direction of the optical axis if it absorbs a small amount of second harmonic light. When the output of the second harmonic light is high, the temperature of the optical waveguide 15 is raised particularly in the vicinity of the exit end face 15b. This temperature rise causes a change in refractive index, which in turn increases a phase-matched wavelength in the vicinity of the exit end face 15b. Consequently, the phase-matched wavelength deviates from the wavelength of the fundamental light and does not contribute to phase matching. This is the cause of nonuniformity of the optical waveguide 15. To solve this problem, the phase matching conditions in the vicinity of the exit end face 15b, where the phase-matched wavelength deviates during high output of the second harmonic light, should be designed so as to correspond to the temperature distribution that occurs during the output. In other words, the polarization inversion period of the optical waveguide 15 in the vicinity of the exit end face 15b may be a little longer than that of the other portions. The configuration of the present invention, in which the optical waveguide 15 is inclined in the vicinity of the exit end face 15b, is very effective for this requirement.

For example, the length of the inclined waveguide 17 measured when it is projected on an extension of the straight waveguide 16 is set to 2 mm. By inclining the optical waveguide 15 in the vicinity of the exit end face 15b, the angle between the direction of the optical axis of the optical waveguide 15 and the polarization inversion region 20 is changed in the vicinity of the exit end face 15b. This change in angle makes the polarization inversion period for the inclined waveguide 17 slightly longer. Thus, it is possible to satisfy the phase matching conditions in the vicinity of the exit end face 15b, where the temperature of the optical waveguide 15 is raised during high output of the second harmonic light. The configuration of the present invention can provide stable output characteristics without causing output saturation even if the second harmonic light has an output of 20 mW or more. A change in phase matching conditions due to the temperature change of the optical waveguide 15 becomes significant in a portion a few millimeters away from the exit end face 15b. Therefore, stable output can be achieved by forming the inclined waveguide 17 in this portion.

Since the inclined waveguide 17 extends straight in the vicinity of the exit end face 15b, the angle θ between the exit end face 15b and the direction of the optical axis of the inclined waveguide 17 becomes constant in the vicinity of the exit end face 15b. Thus, the polishing accuracy of the optical waveguide 15 can be relaxed. For a conventional curved optical waveguide, the angle between the exit end face and the direction of the optical axis of the optical waveguide depends on the polishing accuracy of the exit end face. The optical material substrate 14 made of MgO-doped LiNbO₃ crystals has a refractive index of not less than 2. Therefore, when the angle between the optical waveguide and the exit end face varies by 0.1°, the exit angle varies by 0.20 or more. Thus, very strict polishing accuracy of the exit end face of the optical waveguide is demanded, resulting in higher manufacturing cost. In general, to use the coherent light source 11 with the optical disk 25 or the like, the amount of change in the exit angle of light from the optical waveguide 15 should be controlled to ±0.2°. The present invention allows the angle between the exit end face 15b and the direction of the optical axis of the optical waveguide 15 to be kept constant in the vicinity of the exit end face 15b. Therefore, the angle does not depend on optical polishing, so that the polishing accuracy can be relaxed significantly, resulting in lower manufacturing cost. Specifically, the length of the straight portion 19 of the inclined waveguide 17 measured when it is projected on an extension of the straight optical waveguide 16 may be set to about 0.3 mm or more because the polishing accuracy of about ±0.1 mm can be achieved sufficiently.

In this embodiment, the entrance and exit end faces 15a, 15b of the optical waveguide 15 are substantially parallel to an X-plane or Y-plane of the MgO-doped LiNbO₃ crystals of the optical material substrate 14. That is, the propagation direction of a guided wave in the optical waveguide 15 is substantially parallel to an X-axis or Y-axis of the crystals. Thus, the propagation loss of the optical waveguide 15 can be reduced.

The propagation loss increases with an increase in the tilt of the propagation direction of a guided wave in the optical waveguide 15 with respect to the crystal axis. For example, when the propagation direction tilts about 5°, the propagation loss increases by about 0.5 dB/cm. This is because a tilt of the propagation direction with respect to the crystal axis causes an increase in scattering loss at the interface between the optical waveguide 15 and the substrate 14. The scattering loss is a kind of propagation loss. Therefore, it is desirable to form the optical waveguide 15 in parallel with the crystal axis and to make the length of the optical waveguide 15 that is not parallel to the crystal axis as short as possible. For this purpose, it is desirable that the optical waveguide that is not parallel to the crystal axis, such as the inclined waveguide 17, should be formed in the vicinity of the exit end face 15b. The propagation loss of the optical waveguide 15 can be reduced by forming the inclined waveguide 17 in the vicinity of the exit end face 15b. Specifically, the straight waveguide 16 is formed substantially in parallel with the X-axis or Y-axis of the crystals. This configuration can minimize the propagation loss of the optical waveguide 15. To reduce the propagation loss, the inclined waveguide 17 is formed desirably in a position about 0.2 to 2 mm away from the exit end face 15b, and more desirably in a position about 0.2 to 1 mm away from it. The reason the inclined waveguide 17 is located 0.1 mm or more away from the exit end face 15b is that the curved portion 18 should be at least 0.05 mm and polishing accuracy can be relaxed.

The use of the SHG device 13 in the configuration of the present invention further can reduce the propagation loss of the optical waveguide 15. Since the SHG device 13 converts the fundamental light into the harmonic light, the optical waveguide 15 is designed mainly for the fundamental light. Therefore, the optical waveguide 15 operates under the multimode conditions for the second harmonic light having a short wavelength. Consequently, the second harmonic light is trapped within the optical waveguide 15 and is affected little by the propagation loss in the periphery of the optical waveguide 15. Thus, the propagation loss of the harmonic light can be reduced even with the optical waveguide 15 that is not parallel to the crystal axis. In the inclined waveguide 17, the effect of radiation loss on the harmonic light is smaller than that on the fundamental light for the same reason. The radiation loss in the curved portion 18 depends on its curvature. Therefore, the radiation loss in the curved portion 18 can be reduced by forming the curved portion 18 with a small curvature. The radiation loss in the curved portion 18 further can be reduced in such a manner that the optical waveguide 15 is designed so as to minimize a coupling with the radiation mode. On the other hand, the radiation loss of the fundamental light caused by the inclined waveguide 17 is effective in reducing light returning to the semiconductor laser 12. When the fundamental light returns to an active layer of the semiconductor laser 12, noise is increased. By using the inclined waveguide 17, the return light of the fundamental light is attenuated in the curved portion 18. Moreover, the fundamental light returning from the outside to the optical waveguide 15 also is attenuated. In this manner, the return light to the semiconductor laser 12 is reduced by the inclined waveguide 17, thus achieving a light source that is hardly affected by noise due to the return light.

Second Embodiment

This embodiment describes another configuration of an optical waveguide device of the present invention.

Radiation loss depends on the wavelength of a guided wave in the inclined waveguide 17 of the SHG device 13, and the radiation loss of harmonic light is greater than that of fundamental light. Therefore, the harmonic light can have multimode easily as compared with the fundamental light.

Figure 4A:
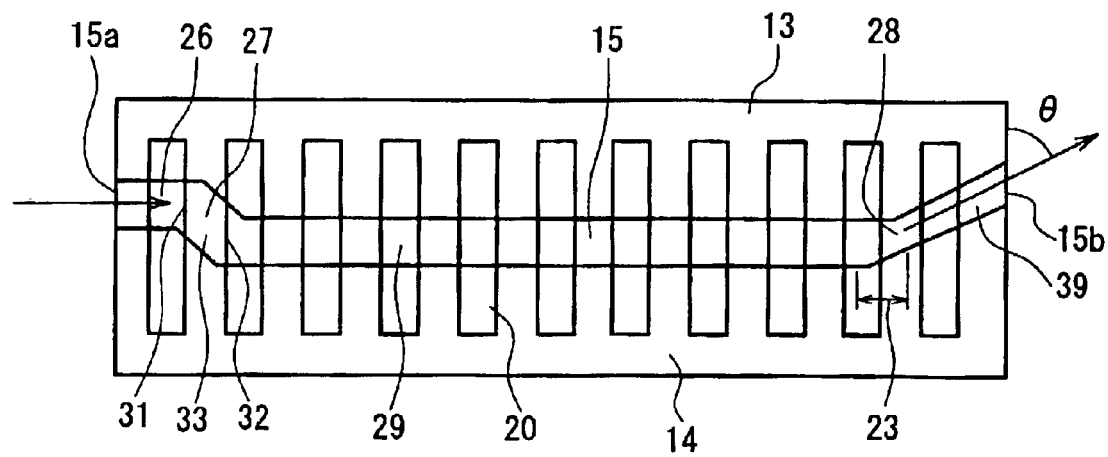
FIG. 4A is a plan view showing an optical waveguide device according to a second embodiment of the present invention.

FIG. 4A is a plan view showing an optical waveguide device according to a second embodiment of the present invention. A second harmonic generation device (SHG device) 13 that has the following configuration is used as the optical waveguide device.

The SHG device 13 is substantially in the form of a rectangular parallelepiped and includes an optical material substrate 14 made of MgO-doped LiNbO₃ crystals. A high refractive index region with a width of about 3 μm and a depth of about 2 μm is formed on the optical material substrate 14 by a proton-exchange method. This high refractive index region functions as an optical waveguide 15. To compensate for a difference in propagation constant between the fundamental light and the harmonic light, a periodic polarization inversion region 20 is formed on the optical waveguide 15. The optical waveguide 15 has an entrance end face 15a and an exit end face 15b that are substantially parallel to each other. The above configuration is the same as that in the first embodiment.

The optical waveguide 15 includes the following: a straight waveguide 26 that extends from the entrance end face 15a in the direction substantially perpendicular thereto; inclined waveguides 27, 28 that are formed in the vicinity of the entrance end face 15a and the exit end face 15b, respectively, to change the propagation direction of a guided wave; and a straight waveguide 29 that extends in the direction substantially perpendicular to the entrance end face 15a and connects the inclined waveguide 27 and the inclined waveguide 28. The inclined waveguide 27 is connected smoothly to the straight waveguide 26 and to the straight waveguide 29. The inclined waveguide 27 includes curved portions 31, 32, which are connections to the straight waveguides 26, 29, and a straight portion 33. The inclined waveguide 28 is connected smoothly to the straight waveguide 29. The inclined waveguide 28 includes a curved portion 23, which is a connection to the straight waveguide 29, and a straight portion 39. Since the straight waveguide 26 is substantially perpendicular to the entrance end face 15a, a semiconductor laser can be coupled to the straight waveguide 26 with high efficiency. Moreover, the direction of an optical axis passing through the straight portion 39 (i.e., the propagation direction of a guided wave) forms an angle θ with the exit end face 15b. Here, θ is not 90°.

To eliminate loss of the fundamental light and increase radiation loss of the harmonic light, the inclined waveguide 27 is designed so that only harmonic light is scattered. For this purpose, e.g., the inclined waveguide 27 tilts 6° with respect to the direction of the optical axes of the straight waveguides 26, 29, and the curved portions 31, 32 have a length of not more than 0.02 mm. The radiation loss of the harmonic light in the vicinity of the exit end face 15b causes attenuation of the exiting harmonic light. To reduce loss of the harmonic light, the length of the curved portion 23 is set to about 0.1 mm. This embodiment is characterized by the inclined waveguide 27 formed in the vicinity of the entrance end face 15b of the optical waveguide 15. The operation of this optical waveguide device (the SHG device 13) will be described below.

The fundamental light incident on the entrance end face 15a is converted into the harmonic light by the SHG device 13 and exits from the exit end face 15b. The harmonic light exiting from the exit end face 15b is reflected, e.g., from an optical system outside the SHG device 13 and returns to the optical waveguide 15 through the exit end face 15b. The harmonic light entering the optical waveguide 15 passes through the curved portions 23, 32, 31 and reaches the entrance end face 15a. At this time, the returning harmonic light is radiated and scattered in the curved portions 32, 31 of the inclined waveguide 27. Therefore, the harmonic light that reaches the entrance end face 15a is suppressed to 10% or less, thus reducing interference noise.

A single curved portion can reduce interference noise to about ⅕ and, e.g., two curved portions can reduce interference noise to about ¹⁄₂₅. The returning harmonic light is reflected from the entrance end face 15a and passes through the inclined waveguide 27 again, thus reducing interference noise further.

In this embodiment, three curved portions are formed. However, the number of the curved portions is not limited to three. By increasing the curved portions, the interference noise due to return light can be reduced further.

The return light of the harmonic light contributes to mode conversion. When the returning harmonic light passes through the curved portions 31, 32, it is not only radiated and scattered but also converted into a higher-order mode. The harmonic light in the higher-order mode does not interfere with the harmonic light before conversion because of a difference in propagation constant between them. Thus, interference noise can be reduced further.

When the SHG device is used in a confocal optical system, interference noise occurs easily. Therefore, the present invention is effective particularly for such a configuration.

Figure 4B:
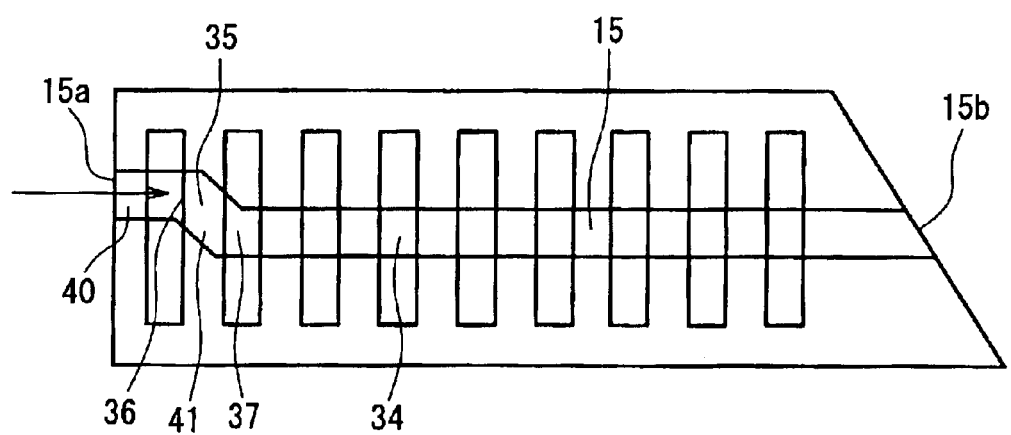
FIG. 4B is a plan view showing another configuration of an optical waveguide device according to the second embodiment.

The configuration of the present invention also can be applied to an optical waveguide device (SHG device) as shown in FIG. 4B. In this SHG device, there is no curved portion in the vicinity of an exit end face 15b of an optical waveguide 15, and the exit end face 15b tilts. The optical waveguide 15 includes the following: a straight waveguide 40 that extends from an entrance end face 15a of the optical waveguide 15 in the direction substantially perpendicular thereto; an inclined waveguide 35 that is formed in the vicinity of the entrance end face 15a to change the propagation direction of a guided wave; and a straight waveguide 34 that connects the inclined waveguide 35 and the exit end face 15b. The inclined waveguide 35 is connected smoothly to the straight waveguide 40 and to the straight waveguide 34. The inclined waveguide 35 includes curved portions 36, 37, which are connections to the straight waveguides 40, 34, and a straight portion 41. The exit end face 15b tilts with respect to the straight waveguide 34.

By forming the inclined waveguide 35 in the vicinity of the entrance end face 15a, the harmonic light returning to the optical waveguide 15 through the exit end face 15b is radiated and scattered in the curved portions 36, 37. Thus, interference noise can be reduced significantly.

When a plurality of guided waves with different wavelengths propagate in the optical waveguide device of the present invention, any guided wave can be attenuated or separated. Therefore, the optical waveguide device of the present invention can be used, e.g., for separating pump light from signal light in a laser or amplifier that includes a harmonic generation device and an optical waveguide. Here, the harmonic generation device utilizes the nonlinear optical effect to perform difference frequency oscillation, sum frequency oscillation, parametric oscillation, or the like. The present invention is effective particularly when the SHG device 13 is used as the optical waveguide device. The SHG device 13 can facilitate wavelength separation in the curved portions 31, 32, 23, 36 and 37. In a conventional optical waveguide, it is difficult for both of the guided waves with largely different wavelengths (e.g., the wavelength of the fundamental light is two times that of the harmonic light in the SHG device) to satisfy the single mode conditions. The conventional optical waveguide operates in multimode for the guided wave having a short wavelength. In such a case, there are a plurality of propagation modes for the guided wave, so that the waveguide mode of this guided wave cannot be controlled. Moreover, the radiation loss in the curved potions 31, 32, 23, 36 and 37 differs largely depending on the mode, which makes the control more difficult. When the SHG device 13 is used, it is necessary to establish phase matching. Once the phase matching is established, the propagation constant of the second harmonic light is determined automatically, and the waveguide mode can be selected under the phase matching conditions. Thus, the radiation loss in the curved portions 31, 32, 23, 36 and 37 can be controlled.

Third Embodiment

Figure 5:
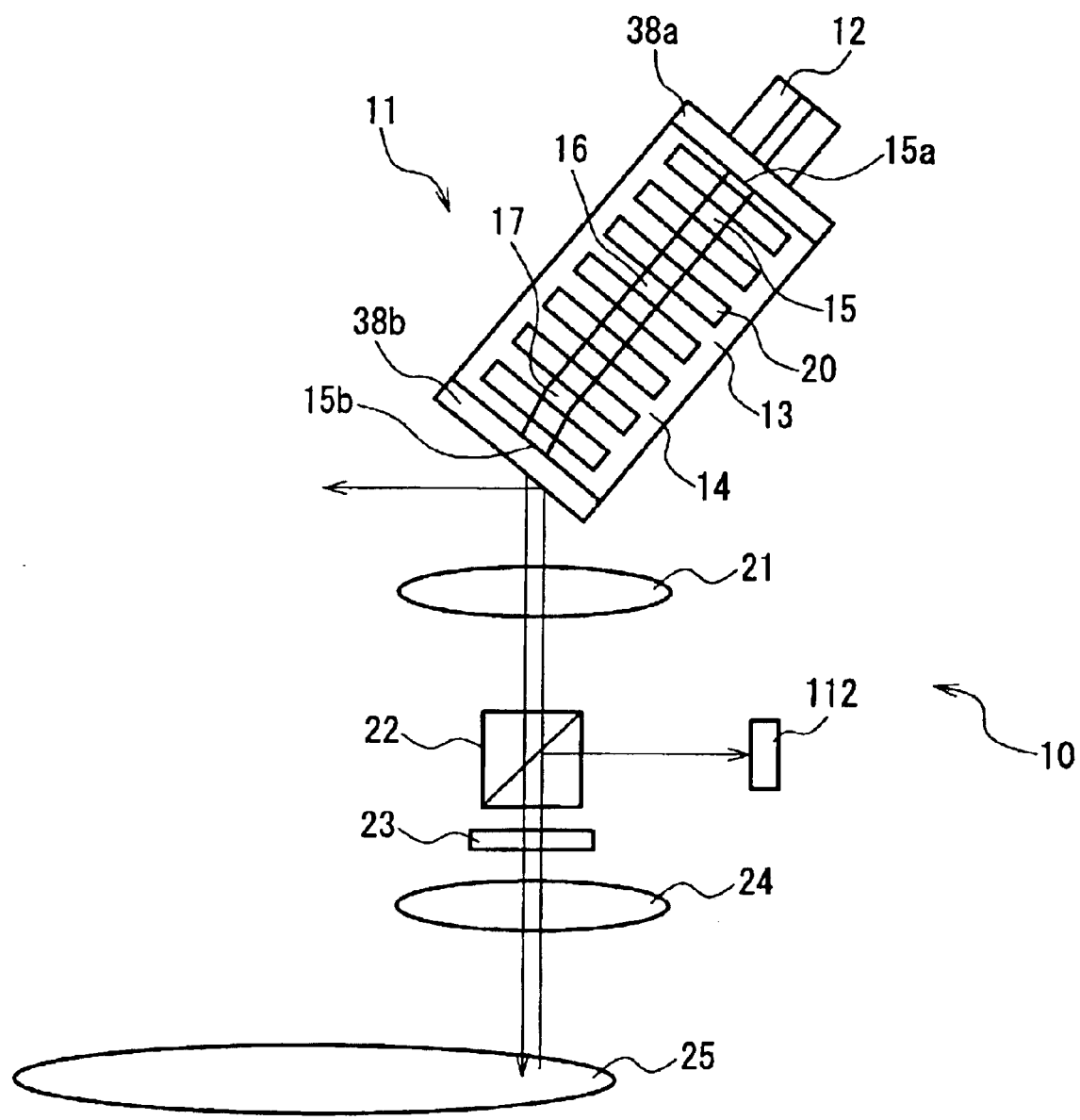
FIG. 5 is a schematic view showing the configuration of an optical apparatus according to a third embodiment of the present invention.
Figure 6:
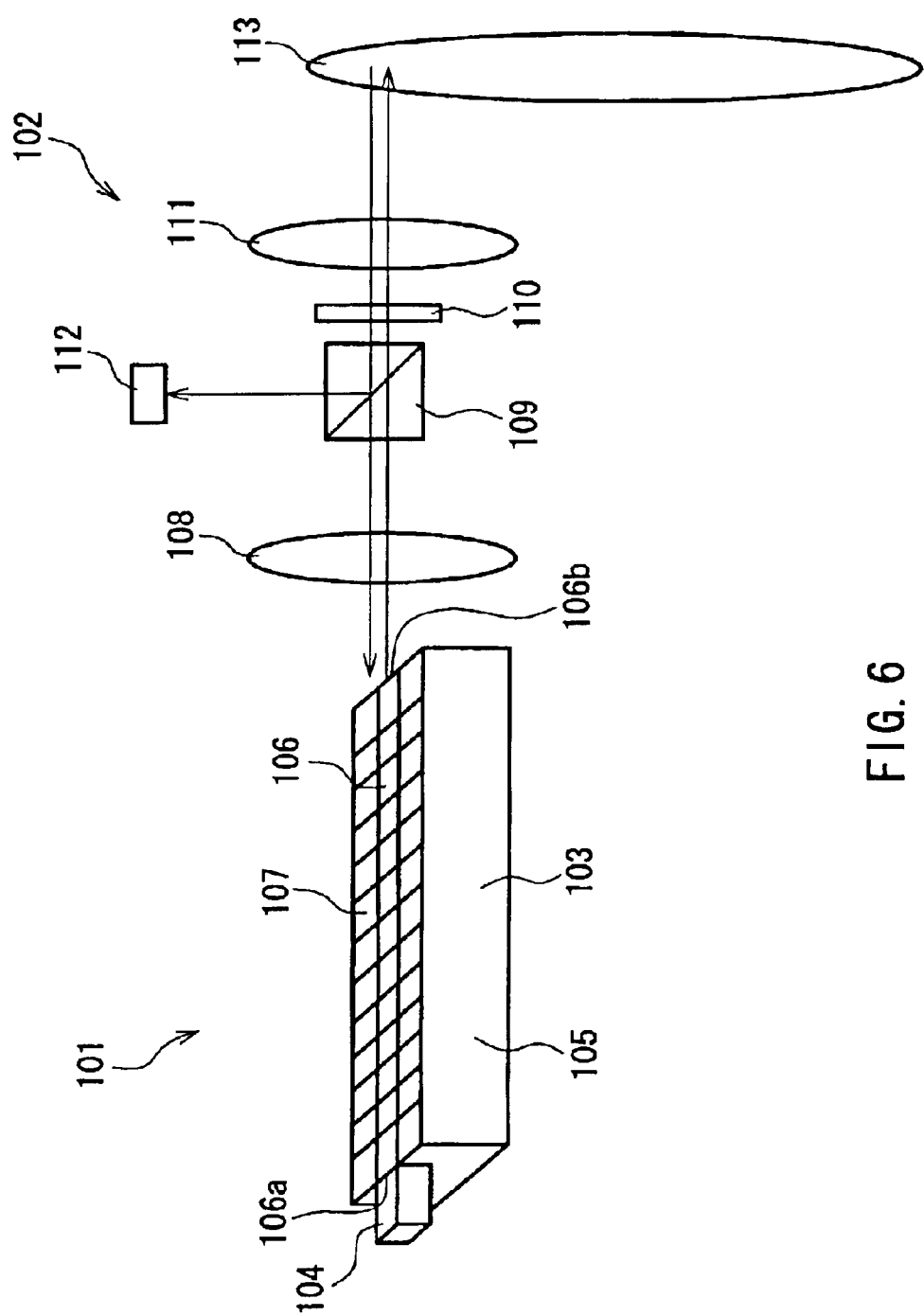
FIG. 6 is a schematic perspective view showing an example of a conventional optical apparatus that includes a SHG blue light source using a SHG device.
Figure 7:
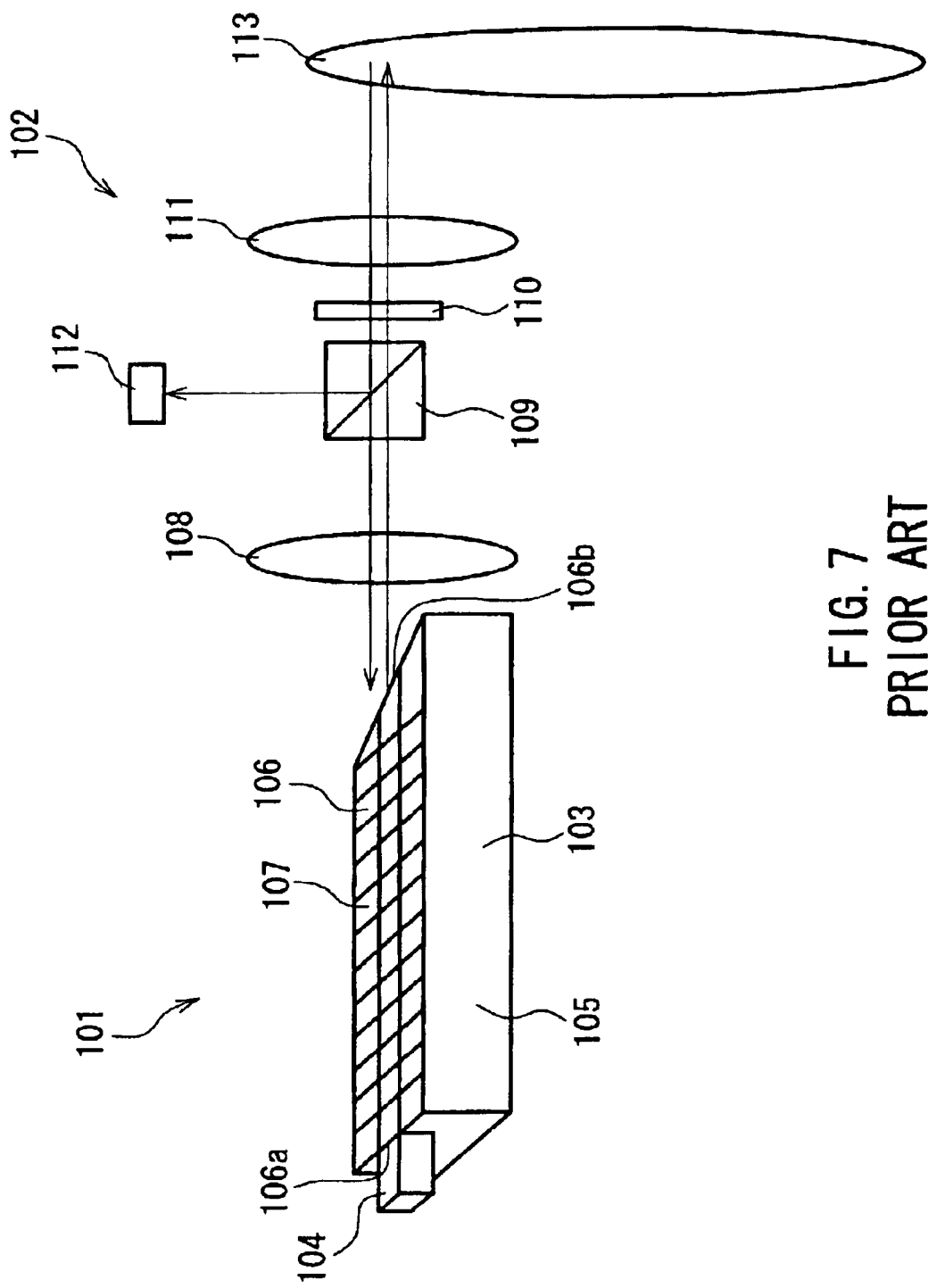
FIG. 7 is a schematic perspective view showing another example of a conventional optical apparatus.
Figure 8:
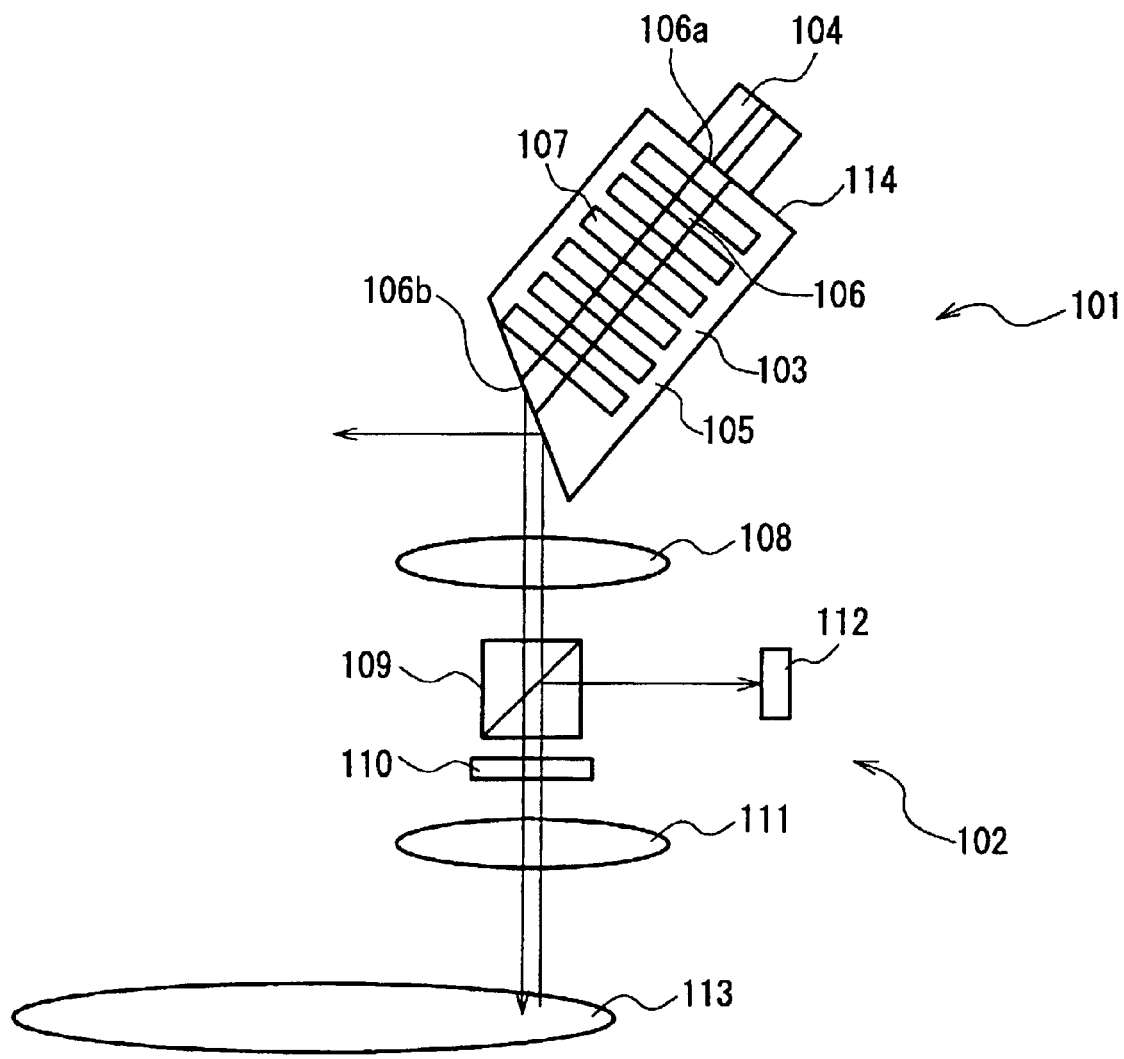
FIG. 8 is a schematic view showing another example of the configuration of a conventional optical apparatus.
Figure 9:
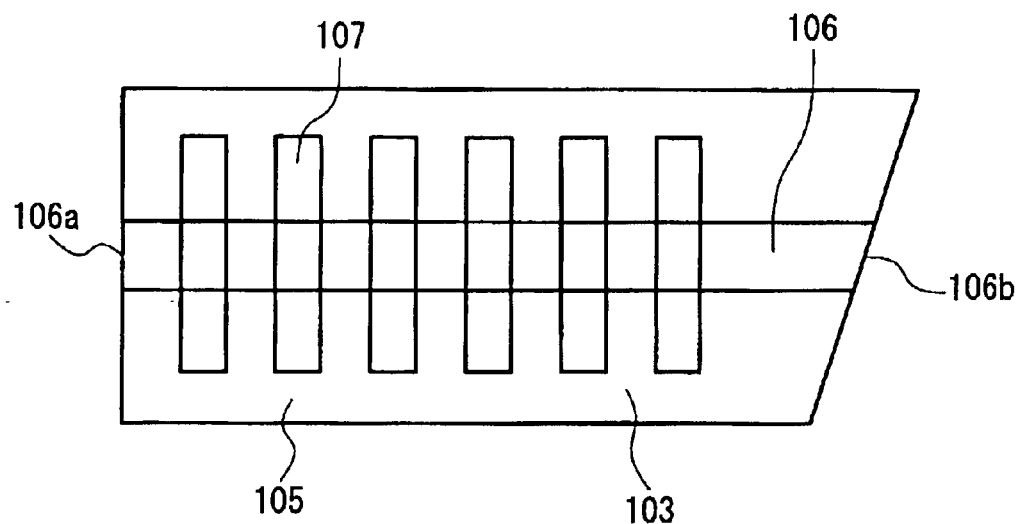
FIG. 9 is a plan view showing an optical waveguide device that is a component of another example of a conventional optical apparatus.
Figure 10:
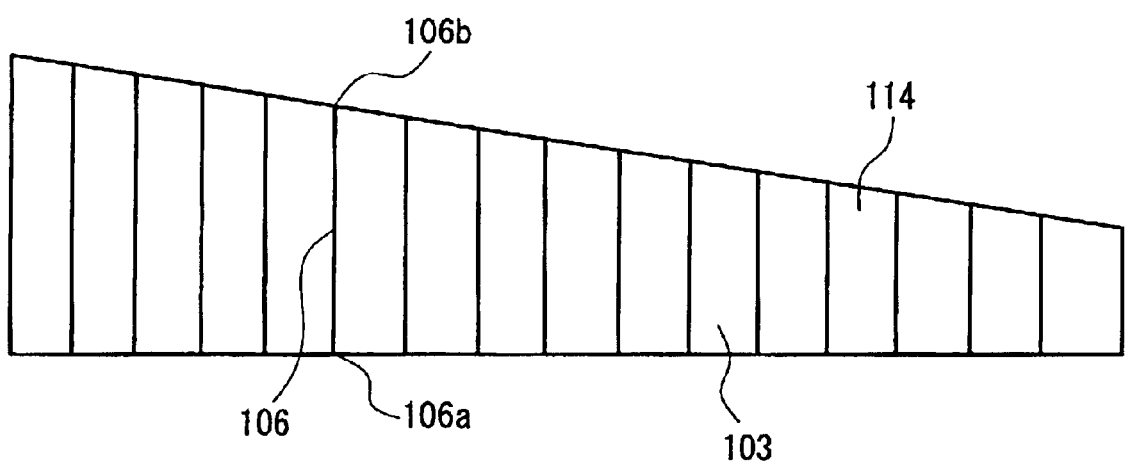
FIG. 10 is a plan view showing an optical material substrate used for mass production of a conventional optical waveguide device.

FIG. 5 is a schematic view showing the configuration of an optical apparatus according to a third embodiment of the present invention. In this embodiment, a SHG device 13 having the same configuration as the first embodiment is used as an optical waveguide device.

As shown in FIG. 5, a coherent light source 11 of this embodiment includes antireflection films 38a, 38b formed on an entrance end face 15a and an exit end face 15b of an optical waveguide 15, respectively. Each of the antireflection films is a multi-layer film and used for both fundamental light and harmonic light. It is desirable that the antireflection film 38a on the entrance end face 15a is made of a material having a small absorptance of the fundamental light and a large absorptance of the harmonic light. Examples of the material include Si, GaP, $Bi_2O_3$, and SiO. It is desirable that the antireflection film 38a is provided so as to prevent reflection of both the fundamental light and the harmonic light. Moreover, it is desirable that the antireflection film 38b on the exit end face 15b is made of a material having a small absorptance of the fundamental light and the harmonic light. When a material having a large absorptance is used for the exit end face 15b, the temperature is raised due to absorption, which may damage the exit end face. Examples of the material for the antireflection film 38b include $SiO_2$, $Ta_2O_5$, $Nb_2O_5$ and $TiO_2$.

In an optical system including the SHG device 13, the end faces (i.e., the entrance and exit end faces 15a, 15b) of the optical waveguide 15 and a focusing point constitute a confocal optical system. Thus, return light reflected from the entrance end face or the exit end face causes interference noise.

In the confocal optical system including the SHG device 13 of this embodiment, the direction of an optical axis passing through the optical waveguide 15 (i.e., the propagation direction of a guided wave) intersects with the exit end face 15b at an angle θ other than 90°. Therefore, light reflected from the exit end face 15b does not return to the confocal optical system, so that interference noise caused in the confocal optical system can be reduced significantly. When the numerical aperture (NA) of a collimator lens 21 is set so that light reflected from the exit end face 15b does not return to the confocal optical system, the interference noise can be reduced further. Moreover, the antireflection film 38b prevents reflection of the return light of the harmonic light, and thus the interference noise can be reduced further. The noise of a semiconductor laser 12 caused by the return light of the fundamental light can be reduced in such a manner that the direction of the optical axis of an inclined waveguide 17 tilts at an angle other than 90° with respect to the exit end face 15b. Since the antireflection film 38b prevents reflection of the fundamental light, interference noise caused in the confocal optical system due to the fundamental light reflected from the exit end face 15b can be reduced significantly. Specifically, the antireflection film 38b can suppress the reflectance of the fundamental light to 0.5% or less, thus achieving a significant reduction in interference noise caused in the confocal optical system.

The antireflection film 38a on the entrance end face 15a allows the fundamental light emitted from the semiconductor laser 12 to be coupled efficiently to the optical waveguide 15. In addition, the antireflection film 38a can reduce noise caused by the return light to the semiconductor laser 12.

When the semiconductor laser 12 and the optical waveguide 15 are coupled directly, the coupling efficiency is decreased if the entrance end face 15a tilts with respect to the direction of the optical axis of the optical waveguide 15. Therefore, the technique of tilting the entrance end face 15a is not practical to reduce interference noise, which is caused by the return light of the fundamental light that is emitted from the semiconductor laser 12 and then reflected from the entrance end face 15a.

For this reason, this embodiment provides the antireflection film 38a on the entrance end face 15a to prevent reflection of the fundamental light and to reduce interference noise. Moreover, the entrance end face 15a is formed perpendicular to the direction of the optical axis of the optical waveguide 15, thereby improving the coupling efficiency of the semiconductor laser 12 and the optical waveguide 15. With the antireflection film 38a, an increase of 10% or more in the coupling efficiency increases output of the harmonic light by 20% or more. Further, the antireflection film 38a can suppress the return light of the fundamental light to 1% or less, thus reducing interference noise.

The harmonic light reflected from the entrance end face 15a causes interference noise in the confocal optical system.

Therefore, this embodiment provides the antireflection film 38a on the entrance end face 15a to prevent reflection of the harmonic light and to reduce the interference noise.

In this embodiment, the antireflection films 38a, 38b, each of which is used for the fundamental light and the harmonic light, are formed on the entrance end face 15a and the exit end face 15b, respectively. However, either the entrance end face 15a or the exit end face 15b may be provided with an antireflection film 38 to be used for the fundamental light and the harmonic light. Alternatively, at least one of the entrance and exit end faces 15a, 15b may be provided with an antireflection film 38 to be used only for the fundamental light.

In the above embodiments, the inclined waveguides 17, 27, 28 and 35 are used as a means for changing the propagation direction of a guided wave. However, any configuration can be employed, such as a directional coupler, a Y-branch waveguide and a means for deflecting the propagation direction of a guided wave by using a reflection grating, as long as it can change the propagation direction.

In the above embodiments, a device having a single optical waveguide is explained as an example of the optical waveguide structure. However, an optical waveguide device of the present invention also can be applied to a configuration in which a plurality of optical waveguides, e.g., multi-branched waveguides, are used to separate light emitted from a plurality of light sources into one waveguide or two or more waveguides, or a configuration in which the plurality of optical waveguides are used to separate light emitted from a single light source into many waveguides.

In the above embodiments, the optical waveguide 15 is produced by a proton-exchange method. However, the present invention is effective for optical waveguide devices including an optical waveguide with any configuration, e.g., an optical waveguide obtained by other ion-exchange methods, a berried optical waveguide such as a metal-diffused optical waveguide, and a ridge or loaded optical waveguide.

In the above embodiments, the SHG device (the second harmonic generation device) 13 is used as the optical waveguide device. However, the optical waveguide device is not limited particularly thereto. For example, devices with various functions and configurations can be used, such as a high-speed modulation device, a phase shifter, a frequency shifter, and a polarization control device. The optical waveguide device of the present invention can be applied to all the above optical waveguide devices and the optical systems using a coherent light source that includes any of these optical waveguide devices. The coherent light source 11 that includes the SHG device 13 often uses a high-coherence DBR semiconductor laser as the semiconductor laser 12 to generate high-coherence harmonic light, and thus interference noise occurs easily. However, the interference noise can be reduced most effectively by combining the coherent light source 11 with the optical waveguide device 10 of the present invention.

In the above embodiments, the confocal optical system is described by taking the optical pickup system as example. However, the present invention also can be applied to other coherent optical systems, such as a laser scanning microscope and a laser printer. In particular, the optical waveguide device of the present invention is suitable for the optical pickup system for the following reasons: an optical disk, which is an object to be observed, has a high reflectance; the position of an objective lens is controlled to focus light on the optical disk continually, so that the confocal optical system is maintained; and the interference conditions change moment by moment due to up-and-down vibrations of the optical disk, causing interference noise easily.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An optical waveguide device for converting fundamental light propagating in an optical waveguide to harmonic light propagating in the optical waveguide, comprising:

a substrate provided with the optical waveguide, the optical waveguide having a periodic polarization inversion structure; and an entrance end face and an exit end face formed on end portions of the optical waveguide, wherein the optical waveguide comprises a straight waveguide that extends front the entrance end face in a direction substantially perpendicular to the entrance end face and at least one inclined waveguide that is formed between the entrance end face and the exit end face, the entrance end face is substantially parallel to the exit end face, an angle θ between the exit end face and a direction of an optical axis of the optical waveguide at the exit end face is not 90°, the fundamental light and the harmonic light exit from the exit end face, and radiation loss in the in inclined waveguide differs between the fundamental light and the harmonic light.

2. The optical waveguide device according to claim 1, wherein the optical waveguide device is substantially in the form of a rectangular parallelepiped.

3. The optical waveguide device according to claim 1, wherein the angle θ satisfies θ≦87° or θ≧93°.

4. The optical waveguide device according to claim 1, wherein the angle θ satisfies 80°≦θ≦87° or 100≧θ≧93°.

5. The optical waveguide device according to claim 1, wherein the inclined waveguide comprises a straight portion and a curved portion.

6. The optical waveguide device according to claim 1, wherein the substrate is made of MgO-doped LiNbO$_3$ crystals, and the entrance end face and the exit end face are substantially parallel to an X-plane or Y-plane of the crystals.

7. A coherent light source comprising:

a semiconductor laser; and an optical waveguide device, wherein an optical waveguide device according to claim 1 is used as the optical waveguide device.

8. The coherent light source according to claim 7, wherein the optical waveguide device is a second harmonic generation device and converts fundamental light having a wavelength of λ1 that is emitted from the semiconductor laser into second harmonic light having a wavelength of λ2.

9. The coherent light source according to claim 8, wherein at least one of the entrance end face and the exit end face of the optical waveguide is provided with an antireflection film to be used for at least one of the fundamental light and the second harmonic light.

10. The coherent light source according to claim 8, wherein at least one of the entrance end face and the exit end face of the optical waveguide is provided with an antireflection film to be used for the fundamental light.

11. An optical apparatus comprising:

a coherent light source; and a focusing optical system for focusing light emitted from the coherent light source on an object to be observed, wherein a coherent light source according to claim 7 is used as the coherent light source, and the optical waveguide device of the coherent light source and the object to be observed have a confocal relationship.

12. The optical apparatus according to claim 11, wherein the object to be observed is an optical disk.

* * * * *